(12) United States Patent
Singh et al.

(10) Patent No.: US 11,799,428 B2
(45) Date of Patent: Oct. 24, 2023

(54) FAST OFFSET CALIBRATION FOR SENSOR AND ANALOG FRONT END

(71) Applicant: Cirrus Logic International Semiconductor Ltd., Edinburgh (GB)

(72) Inventors: Saurabh Singh, Cedar Park, TX (US); Chandra B. Prakash, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 23 days.

(21) Appl. No.: 17/573,000

(22) Filed: Jan. 11, 2022

(65) Prior Publication Data
US 2023/0031363 A1    Feb. 2, 2023

Related U.S. Application Data (60) Provisional application No. 63/227,086, filed on Jul. 29, 2021.

(51) Int. Cl.
*H03F 3/04*    (2006.01)
*G01D 18/00*    (2006.01)

(52) U.S. Cl.
CPC .............. *H03F 3/04* (2013.01); *G01D 18/00* (2013.01); *H03F 2200/375* (2013.01)

(58) Field of Classification Search
CPC .... H02M 1/143; H03F 3/04; H03F 2200/375; H03F 2200/372; H03F 1/26; H04B 10/697; H04B 15/005; G11B 20/24; G11B 23/0007; G01D 18/00
See application file for complete search history.

(56) References Cited

U.S. PATENT DOCUMENTS

| | | | |
|---|---|---|---|
| 6,249,753 B1 * | 6/2001 | Mason | G01D 3/022 702/104 |
| 9,685,967 B1 * | 6/2017 | Motz | H03M 3/34 |
| 10,148,237 B2 * | 12/2018 | Raman | H03F 3/45098 |
| 11,307,267 B1 * | 4/2022 | Polley | G01R 33/0035 |
| 2003/0225539 A1 | 12/2003 | Motz et al. | |
| 2004/0150389 A1 * | 8/2004 | Anderson | G01R 35/005 324/130 |
| 2008/0094055 A1 | 4/2008 | Monreal et al. | |

(Continued)

OTHER PUBLICATIONS

Search Report under Section 17, UKIPO, Application No. GB2209864.4, dated Dec. 12, 2022.

*Primary Examiner* — Daniel R Miller
*Assistant Examiner* — Eric Sebastian Von Wald
(74) *Attorney, Agent, or Firm* — Jackson Walker L.L.P (57) ABSTRACT

A method may include receiving, by a calibration circuit, an output of a subsystem comprising the sensor and the analog front end. The method may further include separating the output individually into the sensor offset and the amplifier offset by using inherent properties of separate frequency ranges for the sensor offset and the amplifier offset. The method may also include calibrating, by the calibration circuit, the sensor offset by determining a first calibration value for the sensor offset such that the output approximates zero during an idle-channel condition. The method may additionally include calibrating, by the calibration circuit, the amplifier offset by determining a second calibration value for the amplifier offset such that the output approximates zero during the idle-channel condition.

8 Claims, 7 Drawing Sheets

(56) References Cited

U.S. PATENT DOCUMENTS

| | | | |
|---|---|---|---|
| 2009/0212860 A1* | 8/2009 | Fukuzawa | H03G 3/30 330/181 |
| 2013/0222001 A1 | 8/2013 | Okatake et al. | |
| 2022/0291055 A1* | 9/2022 | Stary | G01K 7/01 |

* cited by examiner

FAST OFFSET CALIBRATION FOR SENSOR AND ANALOG FRONT END

RELATED APPLICATION

The present disclosure claims priority to U.S. Provisional Patent Application Ser. No. 63/227,086, filed Jul. 29, 2021, which is incorporated by reference herein in its entirety.

FIELD OF DISCLOSURE

The present disclosure relates in general to electronic sensor systems and in particular, systems and methods for fast offset calibration of a sensor output signal offset and an analog front end offset of an analog front end coupled to an output of the sensor.

BACKGROUND

A wide variety of applications utilize electronic sensors to measure physical quantities. For example, a strain gauge for detecting pressure or force is often implemented in what is known as a Wheatstone bridge. A Wheatstone bridge is an electrical circuit used to measure an unknown electrical resistance by balancing two legs of a bridge circuit, one leg of which includes the unknown component. The primary benefit of the Wheatstone bridge circuit is its ability to provide extremely accurate measurements, in contrast with something like a simple voltage divider. The unknown electrical resistance may be a variable resistance having a resistance that varies as a function of a force or pressure. However, many other types of electronic sensors may be used to sense physical quantities.

In operation, a sensor may output an analog electrical quantity (e.g., a voltage), which may be conditioned by an analog front end (AFE) for use by an analog-to-digital converter or other circuitry. Real-world electronic components often include non-idealities, and thus, in the presence of an idle channel (e.g., the physical quantity sensed by a sensor is actually zero), a sensor and an AFE may both include offsets which may generate a non-zero output. Such phenomenon may be known as idle-channel noise. Systems and methods to reduce or eliminate idle-channel noise are desirable.

SUMMARY

In accordance with the teachings of the present disclosure, the disadvantages and problems associated with current approaches to minimizing idle-channel noise in an electronic sensor system may be reduced or eliminated.

In accordance with embodiments of the present disclosure, a method for calibrating an amplifier offset for an analog front end and a sensor offset of a sensor coupled to the analog front end may be provided. The method may include receiving, by a calibration circuit, an output of a subsystem comprising the sensor and the analog front end. The method may further include separating the output individually into the sensor offset and the amplifier offset by using inherent properties of separate frequency ranges for the sensor offset and the amplifier offset. The method may also include calibrating, by the calibration circuit, the sensor offset by determining a first calibration value for the sensor offset such that the output approximates zero during an idle-channel condition. The method may additionally include calibrating, by the calibration circuit, the amplifier offset by determining a second calibration value for the amplifier offset such that the output approximates zero during the idle-channel condition.

In accordance with these and other embodiments of the present disclosure, a system for calibrating an amplifier offset for an analog front end and a sensor offset of a sensor coupled to the analog front end may include an input for receiving an output of a subsystem comprising the sensor and the analog front end and a calibration circuit communicatively coupled to the input. The calibration circuit may be configured to separate the output individually into the sensor offset and the amplifier offset by using inherent properties of separate frequency ranges for the sensor offset and the amplifier offset, calibrate the sensor offset by determining a first calibration value for the sensor offset such that the output approximates zero during an idle-channel condition, and calibrate the amplifier offset by determining a second calibration value for the amplifier offset such that the output approximates zero during the idle-channel condition.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
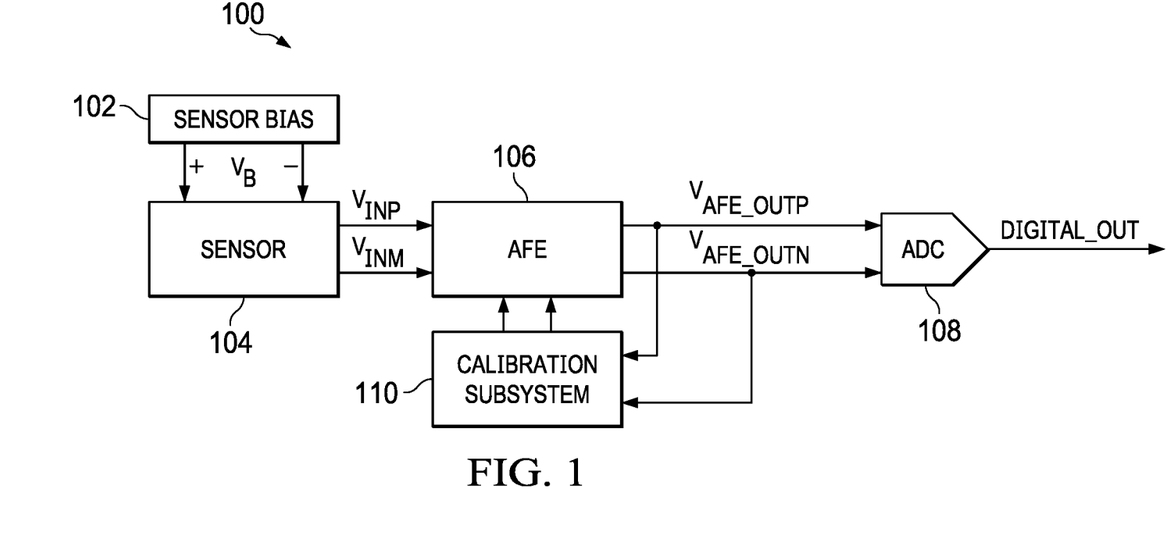
FIG. 1 illustrates a high-level block diagram of an example sensor system, in accordance with embodiments of the present disclosure.

FIG. 1 illustrates a high-level block diagram of an example sensor system 100, in accordance with embodiments of the present disclosure. As shown in FIG. 1, sensor system 100 may include a sensor bias generator 102, a sensor 104, an AFE 106, an analog-to-digital converter 108, and a calibration subsystem 110.

Sensor bias generator 102 may comprise any system, device, or apparatus configured to generate a bias voltage $V_B$ for biasing electronic components of sensor 104. In some embodiments, sensor bias generator 102 may include a voltage regulator, such as a low-dropout regulator.

Sensor 104 may comprise any system, device, or apparatus configured to sense a physical quantity and generate an electrical output signal, such as a differential output signal $V_{in}=V_{inp}-V_{inm}$, indicative of such physical quantity. For example, sensor 104 may sense pressure, temperature, force, humidity, acceleration, or any other suitable physical quantity.

AFE 106 may comprise any suitable system, device, or apparatus to condition a differential input signal (e.g., $V_{in}=V_{inp}-V_{inm}$) received at its input for use by ADC 108. Accordingly, AFE 106 may include analog signal conditioning circuitry comprising analog amplifiers, filters, application-specific integrated circuits for sensors, and/or other circuits to provide a configurable and flexible electronics functional block to interface between sensor 104 and AFE 106.

ADC 108 may comprise any suitable system, device, or apparatus configured to convert an analog signal (e.g., differential AFE output signal $V_{afe\_out}=V_{afe\_outp}-V_{afe\_outn}$) generated by AFE 106 into an equivalent digital signal DIGITAL_OUT.

Calibration subsystem 110 may comprise any suitable system, device, or apparatus configured to measure differential AFE output signal $V_{afe\_out}$ during idle channel conditions, and based on such measurement, determine one or both of a sensor offset of sensor 104 and an AFE offset of AFE 106, as described in greater detail below. Also as described in greater detail below, calibration subsystem 110 may generate control signals for calibrating one or both of the sensor offset and the AFE offset.

Figure 2:
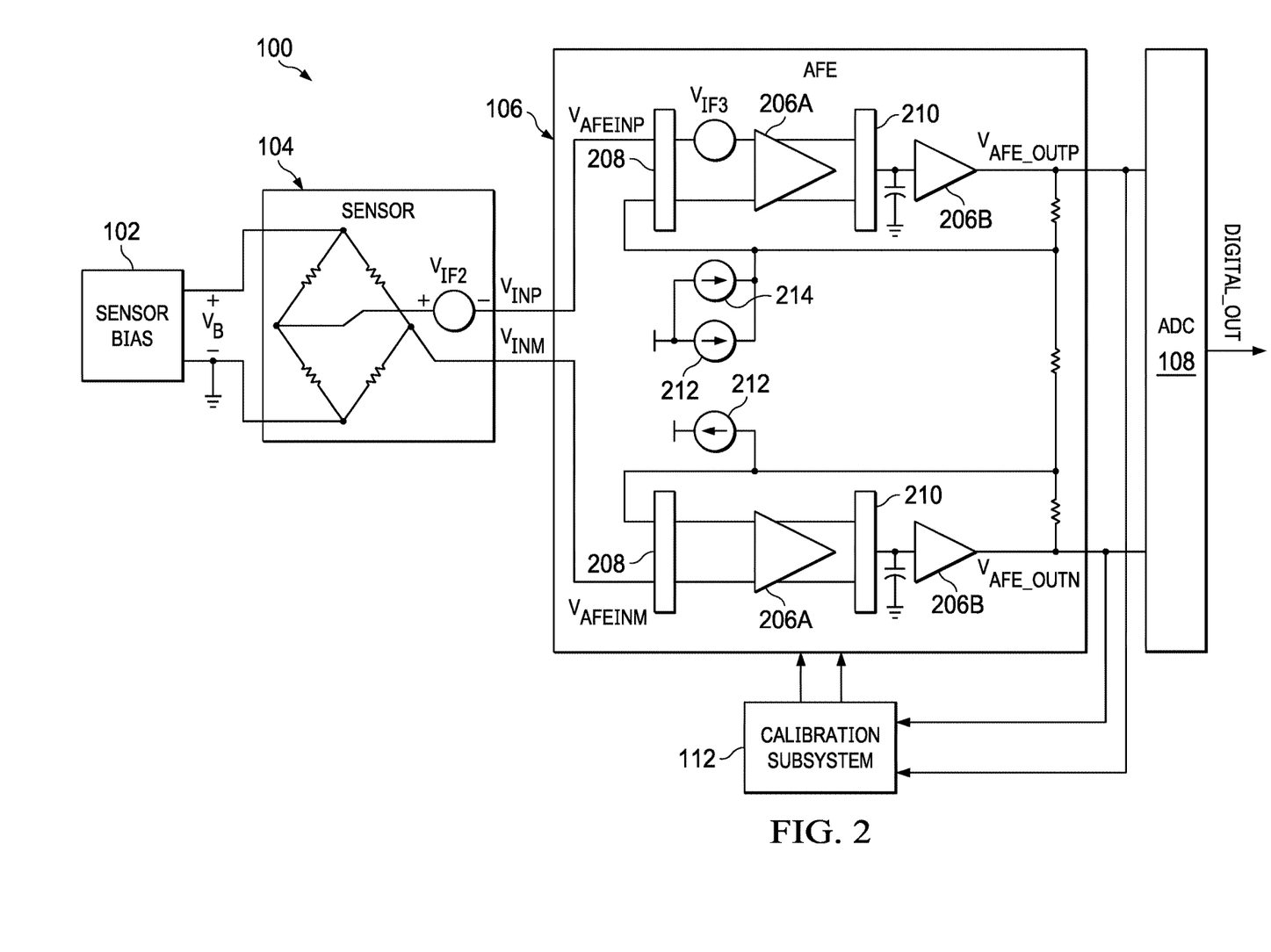
FIG. 2 illustrates the example sensor system of FIG. 1, with example details of selected components for a sensor and an AFE, in accordance with embodiments of the present disclosure.

FIG. 2 illustrates sensor system 100 with example details of selected components for sensor 104 and AFE 106, in accordance with embodiments of the present disclosure. As shown in FIG. 2, sensor 104 may be implemented with a Wheatstone bridge circuit comprising four resistors arranged as shown. Further, sensor 104 may have a sensor offset $V_{If2}$ that appears across the output terminals of sensor 104 in an idle-channel condition (e.g., when resistances of the Wheatstone bridge should be balanced). Sensor 104 is shown implemented as a Wheatstone bridge in FIG. 2 only for purposes of clarity and exposition, and it is understood that sensor 104 may comprise any suitable electronic sensor.

As shown in FIG. 2, AFE 106 may be implemented by two differential signal paths, each path including a first AFE stage 206a and a second AFE stage 206b, wherein one path generates voltage $V_{afe\_outp}$ and the other path generates voltage $V_{afe\_outn}$. As also depicted in FIG. 2, differential current sources 212 may set output common mode independent of the input common mode in accordance with well-known techniques beyond the scope of this disclosure. Another current source 214 may be configured to, based on control signals generated by calibration subsystem 110 (actual connections not shown for purposes of clarity and exposition), generate a variable compensation current to correct for sensor offset, as described in greater detail below. In addition, AFE offset calibration may be performed via offsetting a bias current of one leg of the differential path versus the other leg of the differential path.

Further, each signal path may include a signal chopper 208 at the input of first AFE stage 206a and corresponding signal chopper 210 at the output of first AFE stage 206a. Choppers 208 and 210 may compensate for an AFE offset $V_{If3}$ present in AFE 106, such that AFE offset $V_{If3}$ results in little or no idle-channel noise. However, despite the presence of choppers 208 and 210, the chopping of AFE offset $V_{If3}$ to higher-frequencies may still lead to saturation (e.g., signal clipping) of ADC 108. Accordingly, it may remain desirable to calibrate for the presence of AFE offset $V_{If3}$.

Further, chopping the input of first AFE stage 206a may result in the AFE offset $V_{If3}$ residing in a higher frequency domain compared to sensor offset $V_{If2}$ such that AFE offset $V_{If3}$ is distinguished from sensor offset $V_{If2}$. In alternative embodiments, separating sensor offset $V_{If2}$ and AFE offset $V_{If3}$ may involve chopping the output of the sensor so that sensor offset $V_{If2}$ resides in a higher frequency domain compared to AFE offset $V_{If3}$ and so that sensor offset $V_{If2}$ is distinguished from AFE offset $V_{If3}$.

Figure 3A:
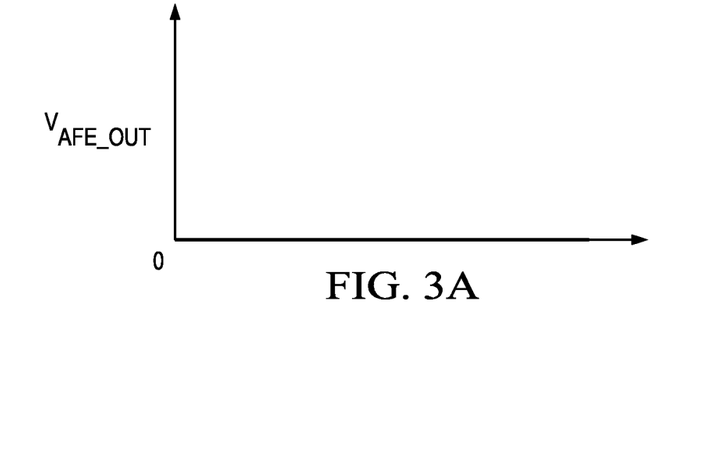
FIGS. 3A-3C illustrate example graphs of an AFE output signal in idle-channel conditions, in accordance with embodiments of the present disclosure.
Figure 3B:
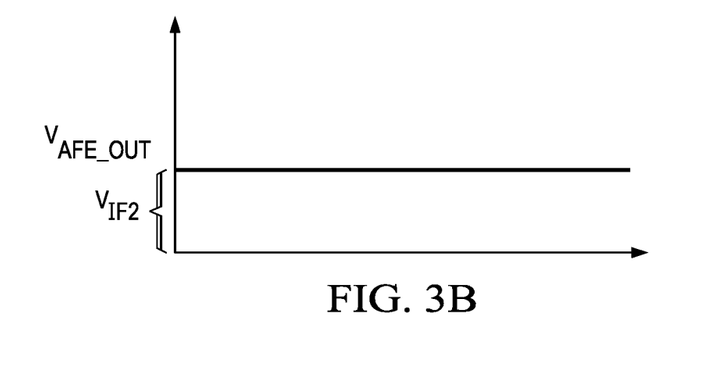
Figure 3C:
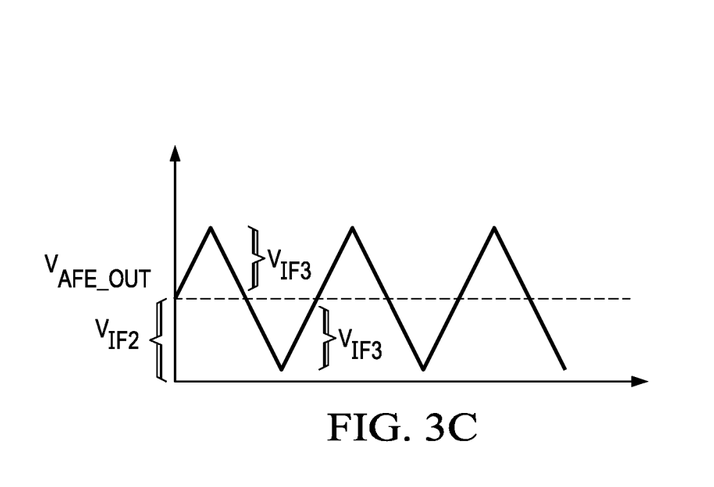

FIGS. 3A-3C illustrate example graphs of AFE output signal $V_{afe\_out}$ in idle-channel conditions, in accordance with embodiments of the present disclosure. As shown in FIG. 3A, during idle-channel conditions in which no sensor offset $V_{If2}$ nor AFE offset $V_{If3}$ is present, AFE output signal $V_{afe\_out}$ may remain constant at zero. However, as shown in FIG. 3B, during idle-channel conditions in which sensor offset $V_{If2}$ is present but no AFE offset $V_{If3}$ is present, AFE output signal $V_{afe\_out}$ may remain constant at a magnitude of sensor offset $V_{If2}$. Further, as shown in FIG. 3C, during idle-channel conditions in which sensor offset $V_{If2}$ and AFE offset $V_{If3}$ are present, AFE output signal $V_{afe\_out}$ may be periodic with a waveform having a magnitude of AFE offset $V_{If3}$ centered at sensor offset $V_{If2}$.

Figure 4:
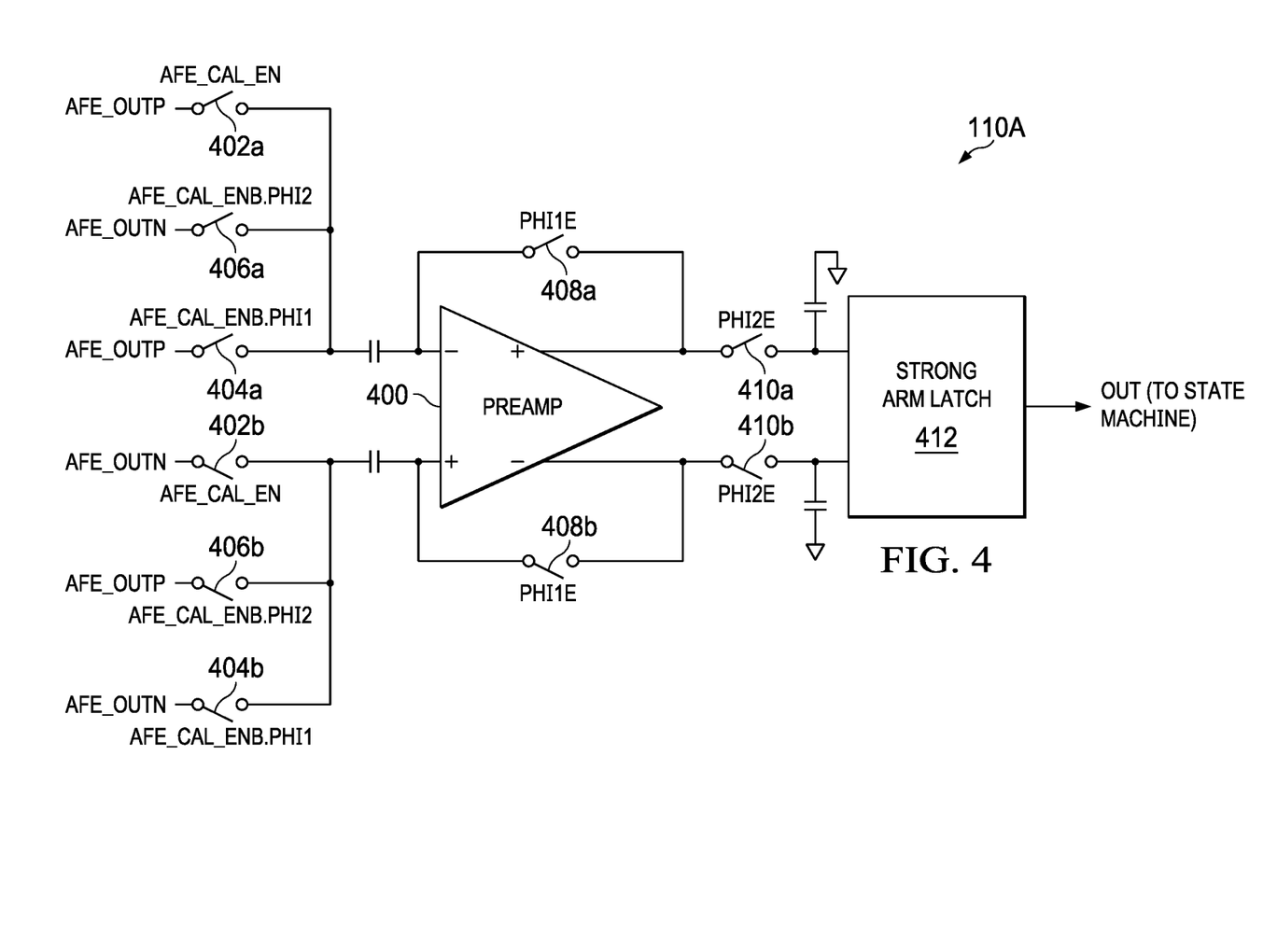
FIG. 4 illustrates selected components of an example calibration subsystem, in accordance with embodiments of the present disclosure.

FIG. 4 illustrates selected components of an example calibration subsystem 110A, in accordance with embodiments of the present disclosure. In some embodiments, calibration subsystem 110A may be used to implement all or a portion of calibration subsystem 110 shown in FIGS. 1 and 2.

Figure 7:
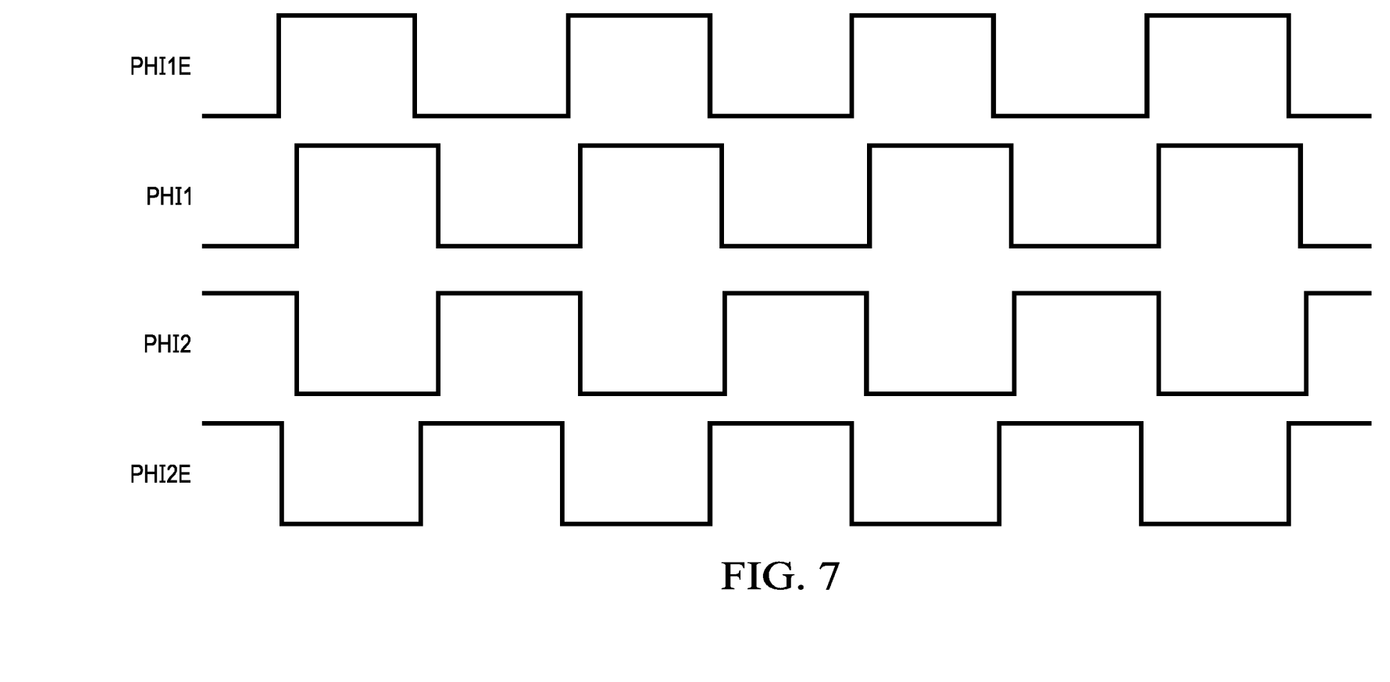
FIG. 7 illustrates example graphs of control waveforms for use in the example calibration subsystems shown in FIGS. 4-6, in accordance with embodiments of the present disclosure.

As shown in FIG. 4, calibration subsystem 110A may include a preamplifier 400 with a differential sampling network coupled to its input. FIG. 7 depicts an example timing relationship of control signal phi1e and control signal afe_cal_enb.phi1 (shown in FIG. 7 as "phi1") and an example timing relationship of control signal phi2e and control signal afe_cal_enb.phi2 (shown in FIG. 7 as "phi2"). Control signal phi1e may be similar in duty cycle and period of control signal afe_cal_enb.phi1, except that control signal afe_cal_enb.phi1 may be a delayed version of control signal phi1e. Control signal phi2e may be similar in duty cycle and period of control signal afe_cal_enb.phi2, except that control signal afe_cal_enb.phi2 may be a delayed version of control signal phi2e. The phases phi1 and phi2 may be the same as the two chopping phases of AFE 106.

The differential sampling network may include input switches 402a, 402b, 404a, 404b, 406a, and 406b arranged as shown in FIG. 4 such that:
  a) when control signal afe_cal_en is asserted, indicating that calibration subsystem 110A is sampling for AFE offset, preamplifier 400 may sample AFE output signal $V_{afe\_out}$ in inverting fashion; and b) when control signal afe_cal_en is deasserted, indicating that calibration subsystem 110A is sampling for sensor offset, preamplifier 400 may sample AFE output signal $V_{afe\_out}$ in inverting fashion.

In addition, calibration subsystem 110A may include feedforward switches 408a and 408b configured to couple each input terminal of preamplifier 400 to a respective inverting output terminal of preamplifier 400 when control signal phi1e is asserted. Further, calibration subsystem 110A may include output switches 410a and 410b, each output switch coupled to a respective output terminal of preamplifier 400. A strong arm latch 412 may sample the output of preamplifier 400 when a control signal phi2e is asserted.

As a result of the architecture of calibration subsystem 110A, calibration subsystem 110A may apply a z-domain filter response $1+z^{-1}$ to AFE offset $V_{lef3}$ and may apply a z-domain filter response $1-z^{-1}$ to sensor offset $V_{lef2}$. Accordingly, during calibration of AFE offset $V_{lef3}$ (e.g., when control signal afe_cal_en is asserted), calibration subsystem 110A may increase or decrease a calibration current (e.g., by controlling an internal current DAC of AFE 106) based on output OUT (e.g., via a state machine that implements an up/down counter). Similarly, during calibration of sensor offset $V_{lef2}$ (e.g., when control signal afe_cal_en is deasserted), calibration subsystem 110A may increase or decrease the calibration current generated by variable current source 214 based on output OUT (e.g., via a state machine that implements an up/down counter).

Figure 5:
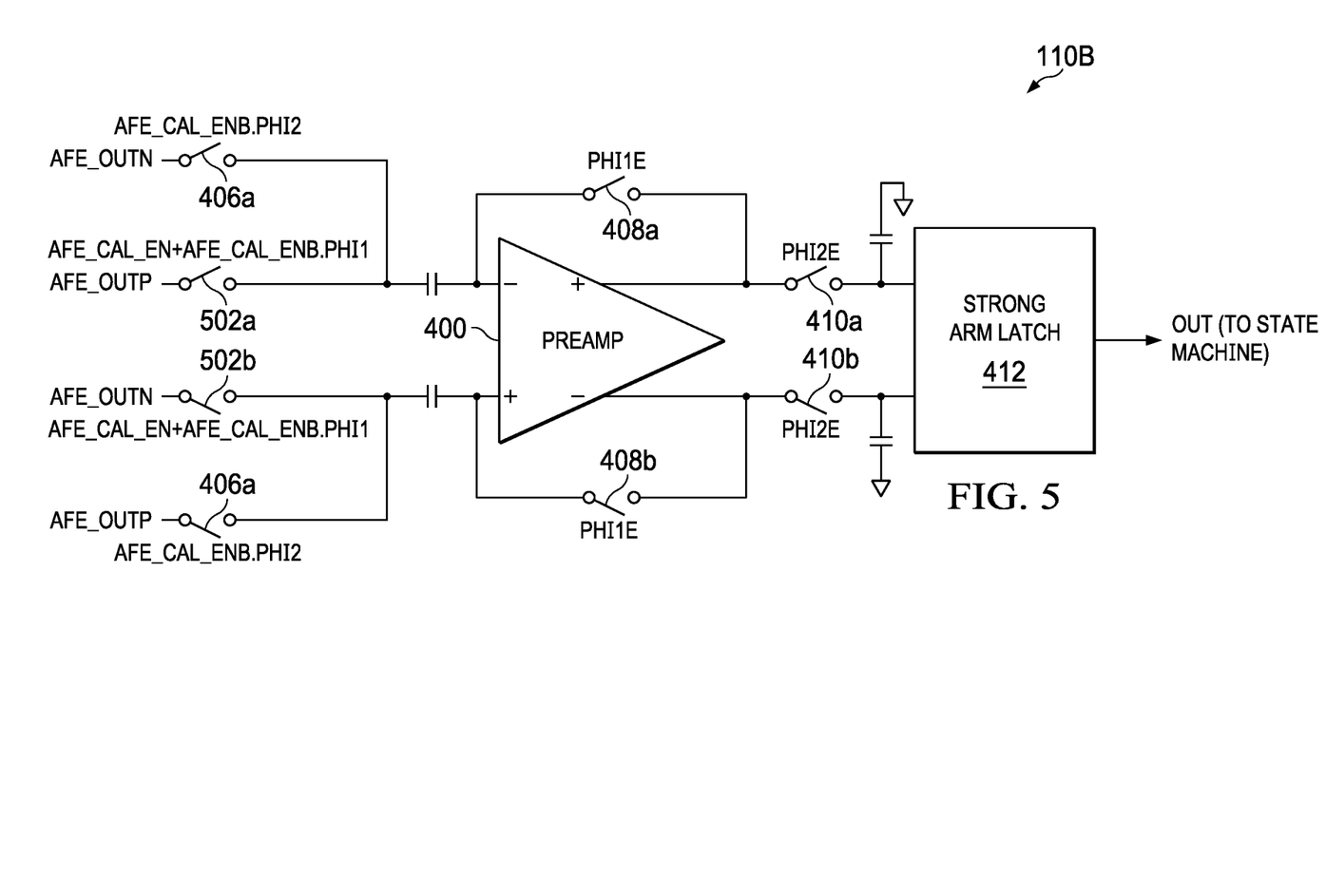
FIG. 5 illustrates selected components of another example calibration subsystem, in accordance with embodiments of the present disclosure.

FIG. 5 illustrates selected components of an example calibration subsystem 110B, in accordance with embodiments of the present disclosure. In some embodiments, calibration subsystem 110B may be used to implement all or a portion of calibration subsystem 110 shown in FIGS. 1 and 2. Further, calibration subsystem 110B of FIG. 5 may be similar in many respects to calibration subsystem 110A of FIG. 4, and thus, only certain differences between calibration subsystem 110B and calibration subsystem 110A may be described below.

In particular, calibration subsystem 110B may include input switch 502a in lieu of (and combining the functionality of) input switches 402a and 404a and input switch 502b in lieu of (and combining the functionality of) input switches 402b and 404b. Those of skill in the art will readily recognize that the architecture of calibration subsystem 110B may possess similar or identical functionality to the architecture of calibration subsystem 110A.

Figure 6:
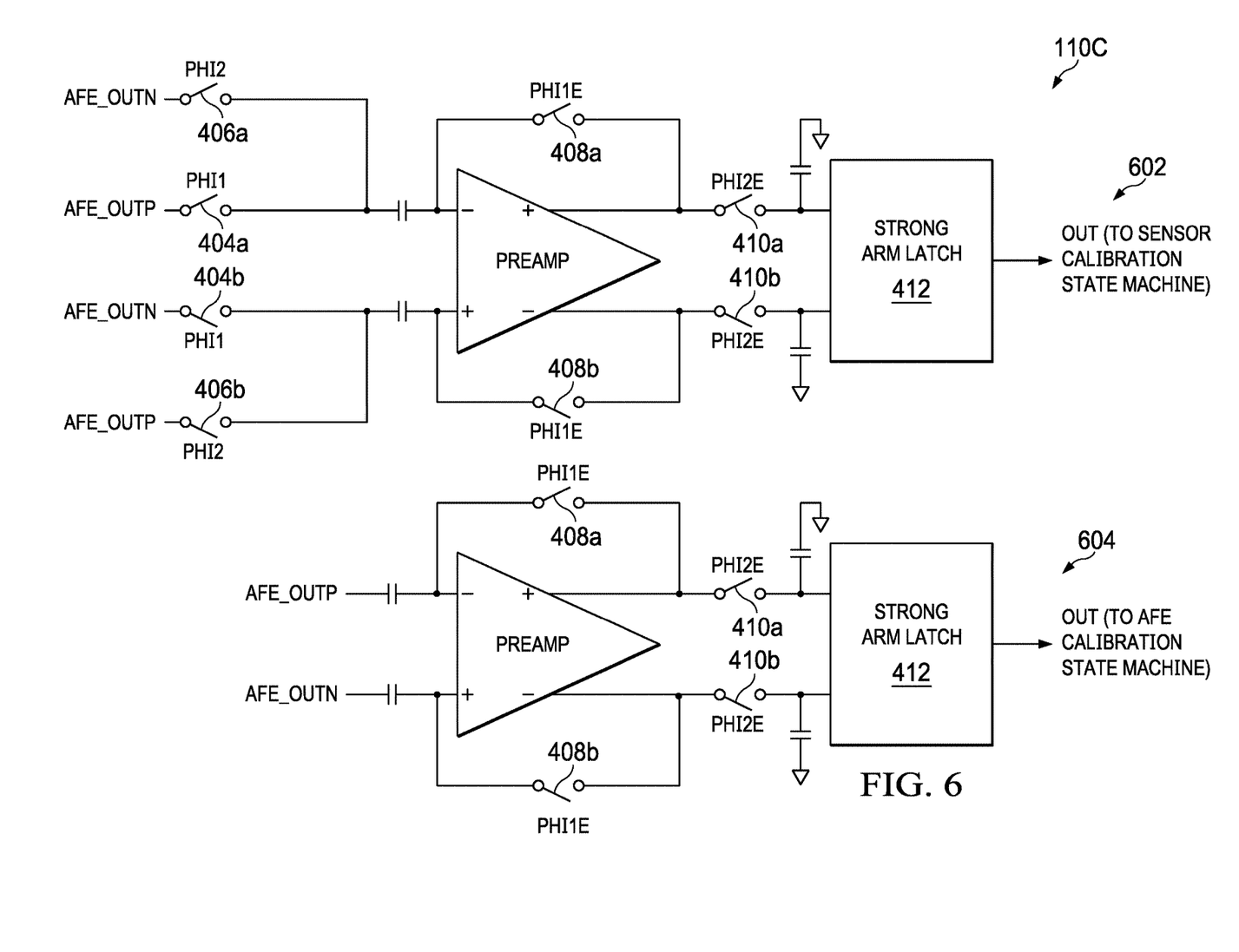
FIG. 6 illustrates selected components of yet another example calibration subsystem, in accordance with embodiments of the present disclosure.

FIG. 6 illustrates selected components of an example calibration subsystem 110C, in accordance with embodiments of the present disclosure. In some embodiments, calibration subsystem 110C may be used to implement all or a portion of calibration subsystem 110 shown in FIGS. 1 and 2. Further, calibration subsystem 110C of FIG. 6 may be similar in many respects to calibration subsystem 110A of FIG. 4 and calibration subsystem 110B of FIG. 5, except that calibration subsystem 110C separates sensor offset calibration and AFE offset calibration into two parallel circuits: a sensor offset calibration circuit 602 and an AFE offset calibration circuit 604. Those of skill in the art will readily recognize that the architecture of calibration subsystem 110C may possess similar or identical functionality to the architectures of calibration subsystem 110A and/or calibration subsystem 110B.

The systems and methods described above may have benefits over existing approaches to minimizing idle-channel noise. For example, the systems and methods described above do not require shorting of a sensor in order to minimize idle-channel noise, as is often the case in existing approaches. In addition, the approaches described herein are faster than existing approaches, and thus may be performed prior to each sensor measurement or during powering on of a circuit comprising the sensor system.

The present disclosure provides methods and systems for calibrating an amplifier/AFE offset $V_{lf3}$ and a sensor offset $V_{lf2}$ for a sensor coupled at its output to an input of the AFE. A calibration circuit may receive an output of the AFE and may individually separate such output into sensor offset $V_{lf2}$ and the AFE offset $V_{lf3}$ by using inherent properties of separate frequency ranges for sensor offset $V_{lf2}$ and AFE offset $V_{lf3}$. The calibration circuit may calibrate sensor offset $V_{lf2}$ by determining a first calibration value (e.g., for a calibration current) for sensor offset $V_{lf2}$ so that the AFE output approaches zero during an idle-channel condition. The calibration block may calibrate the AFE offset $V_{lf3}$ by determining a second calibration value (e.g., for a calibration current) for AFE offset $V_{lf3}$ so that the AFE output approaches zero during an idle-channel condition.

In effect, the calibration circuit may include one set of digital-to-analog converters (DACs) for calibrating sensor offset $V_{lf2}$ and another set of DACs for calibrating AFE offset $V_{lf3}$. In one embodiment, separating sensor offset $V_{lf2}$ and AFE offset $V_{lf3}$ further involves chopping an input of the AFE so that AFE offset $V_{lf3}$ resides in a higher frequency domain compared to the sensor offset $V_{lf2}$ and so that AFE offset $V_{lf3}$ is distinguished from sensor offset $V_{lf2}$. In another embodiment, separating sensor offset $V_{lf2}$ and AFE offset $V_{lf3}$ further involves chopping the output of the sensor so that sensor offset $V_{lf2}$ resides in a higher frequency domain compared to AFE offset $V_{lf3}$ and so that sensor offset $V_{lf2}$ is distinguished from AFE offset $V_{lf3}$.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A method for calibrating an amplifier offset for an analog front end and a sensor offset of a sensor coupled to the analog front end, the method comprising:
   receiving, by a calibration circuit, an output of a subsystem comprising the sensor and the analog front end;
   separating the output individually into the sensor offset and the amplifier offset by using inherent properties of separate frequency ranges for the sensor offset and the amplifier offset;
   calibrating, by the calibration circuit, the sensor offset by determining a first calibration value for the sensor offset such that the output approximates zero during an idle-channel condition; and
   calibrating, by the calibration circuit, the amplifier offset by determining a second calibration value for the amplifier offset such that the output approximates zero during the idle-channel condition.

2. The method of claim 1, wherein the calibration circuit comprises:
   a first set of digital-to-analog converters for calibrating the sensor offset; and
   a second set of digital-to-analog converters for calibrating the amplifier offset.

3. The method of claim 1, wherein separating comprises chopping an input signal of the analog front end such that the amplifier offset resides in a higher frequency domain compared to the sensor offset.

4. The method of claim 1, wherein separating comprises chopping an output signal of the sensor so that the sensor offset resides in a higher frequency domain compared to the amplifier offset.

5. A system for calibrating an amplifier offset for an analog front end and a sensor offset of a sensor coupled to the analog front end, the system comprising:
   an input for receiving an output of a subsystem comprising the sensor and the analog front end; and
   a calibration circuit communicatively coupled to the input and configured to:
      separate the output individually into the sensor offset and the amplifier offset by using inherent properties of separate frequency ranges for the sensor offset and the amplifier offset;
      calibrate the sensor offset by determining a first calibration value for the sensor offset such that the output approximates zero during an idle-channel condition; and
      calibrate the amplifier offset by determining a second calibration value for the amplifier offset such that the output approximates zero during the idle-channel condition.

6. The system of claim 5, wherein the calibration circuit comprises:
   a first set of digital-to-analog converters for calibrating the sensor offset; and
   a second set of digital-to-analog converters for calibrating the amplifier offset.

7. The system of claim 5, wherein separating comprises chopping an input signal of the analog front end such that the amplifier offset resides in a higher frequency domain compared to the sensor offset.

8. The system of claim 5, wherein separating comprises chopping an output signal of the sensor so that the sensor offset resides in a higher frequency domain compared to the amplifier offset.

* * * * *